United States Patent
Peeters et al.

(10) Patent No.: US 8,921,032 B2
(45) Date of Patent: Dec. 30, 2014

(54) SELF-ASSEMBLABLE POLYMER AND METHOD FOR USE IN LITHOGRAPHY

(75) Inventors: Emiel Peeters, Eindhoven (NL); Sander Frederik Wuister, Eindhoven (NL); Roelof Koole, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 143 days.

(21) Appl. No.: 13/700,703

(22) PCT Filed: Apr. 20, 2011

(86) PCT No.: PCT/EP2011/056308
§ 371 (c)(1),
(2), (4) Date: Nov. 28, 2012

(87) PCT Pub. No.: WO2011/151109
PCT Pub. Date: Dec. 8, 2011

(65) Prior Publication Data
US 2013/0078574 A1 Mar. 28, 2013

Related U.S. Application Data

(60) Provisional application No. 61/351,693, filed on Jun. 4, 2010.

(51) Int. Cl.
*G03F 7/004* (2006.01)
*G03F 7/20* (2006.01)
*G03F 7/40* (2006.01)

(52) U.S. Cl.
USPC ......... 430/270.1; 430/317; 430/322; 430/325

(58) Field of Classification Search
USPC .............................. 430/270.1, 317, 322, 325
See application file for complete search history.

(56) References Cited

U.S. PATENT DOCUMENTS 7,625,764 B2 12/2009 Stayton et al.
8,117,573 B2 * 2/2012 Morizawa ................ 716/106
(Continued)

FOREIGN PATENT DOCUMENTS

WO 2009/151834 12/2009

OTHER PUBLICATIONS

International Search Report mailed Jul. 6, 2011 in corresponding International Patent Application No. PCT/EP2011/056308.

(Continued)

*Primary Examiner* — Amanda C. Walke
(74) *Attorney, Agent, or Firm* — Pillsbury Winthrop Shaw Pittman LLP

(57) ABSTRACT

A self-assemblable polymer is disclosed, having first and second molecular configurations with the first molecular configuration has a higher Flory Huggins parameter for the self-assemblable polymer than the second molecular configuration, and the self-assemblable polymer is configurable from the first molecular configuration to the second molecular configuration, from the second molecular configuration to the first molecular configuration, or both, by the application of a stimulus. The polymer is of use in a method for providing an ordered, periodically patterned layer of the polymer on a substrate, by ordering and annealing the polymer in its second molecular configuration and setting the polymer when it is in the first molecular configuration. The second molecular configuration provides better ordering kinetics and permits annealing of defects near its order/disorder transition temperature, while the first molecular configuration, with a higher order/disorder transition temperature, provides low line edge/width roughness for the pattern formed on setting.

20 Claims, 3 Drawing Sheets

(56) References Cited

U.S. PATENT DOCUMENTS

| | | | | |
|---|---|---|---|---|
| 8,323,870 | B2* | 12/2012 | Lee et al. | 430/270.1 |
| 8,334,089 | B2* | 12/2012 | Yi et al. | 430/270.1 |
| 8,399,174 | B2* | 3/2013 | Kim et al. | 430/270.1 |
| 8,450,043 | B2* | 5/2013 | Coady et al. | 430/270.1 |
| 8,574,815 | B2* | 11/2013 | Coady et al. | 430/270.1 |
| 8,592,940 | B2* | 11/2013 | Sandhu et al. | 257/506 |
| 2006/0013956 | A1 | 1/2006 | Angelescu et al. | |
| 2008/0226995 | A1 | 9/2008 | Costanzo et al. | |
| 2009/0042146 | A1* | 2/2009 | Kim et al. | 430/323 |
| 2009/0086208 | A1 | 4/2009 | Kang et al. | |
| 2009/0087653 | A1 | 4/2009 | Nealey et al. | |
| 2009/0155725 | A1* | 6/2009 | Yi et al. | 430/312 |
| 2009/0220614 | A1 | 9/2009 | Qin et al. | |
| 2009/0233236 | A1 | 9/2009 | Black et al. | |
| 2009/0236309 | A1 | 9/2009 | Millward et al. | |

OTHER PUBLICATIONS

HH Shao et al., "Effect of isomer on polymer blends miscibility: a synchrotron small angle X-ray investigation," Composites: Part A, vol. 30, pp. 113-116 (1999).

Sheng Dai et al., "Thermo- and photo-responsive polymeric systems," Soft Matter, vol. 5, pp. 2513-2533 (2009).

Miri Park et al., "Block Copolymer Lithography: Periodic Arrays of ~$10^{11}$ Holes in 1 Square Centimeter," Science, vol. 276, pp. 1401-1404 (May 30, 1997).

* cited by examiner

SELF-ASSEMBLABLE POLYMER AND METHOD FOR USE IN LITHOGRAPHY

This application is the United States national phase entry of PCT patent application no. PCT/EP2011/056308, filed Apr. 20, 2011, which claims the benefit of U.S. provisional patent application no. U.S. 61/351,693, which was filed on Jun. 4, 2010, the contents of both are incorporated herein in their entireties by reference.

FIELD

The present invention relates to methods for manufacture of devices by lithography. In particular, the invention relates to methods for reduction of defects in resist layers, particularly resist layers of self-assembled block copolymers.

BACKGROUND

In lithography for device manufacture, there is an ongoing desire to reduce the size of features in a lithographic pattern in order to increase the density of features on a given substrate area. Patterns of smaller features having critical dimensions (CD) at nano-scale allow for greater concentrations of device or circuit structures, yielding potential improvements in size reduction and manufacturing costs for electronic and other devices. In photolithography, the push for smaller features has resulted in the development of technologies such as immersion lithography and extreme ultraviolet (EUV) lithography.

So-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both photolithography and for imprint lithography, it is desirable to provide high resolution patterning of surfaces, such as of imprint templates or other substrates, and chemical resists may be used to achieve this.

The use of self-assembly of block copolymers (BCPs) has been considered as a potential method for improving the resolution to better values than those obtainable by prior art lithography methods or as an alternative to electron beam lithography for preparation of imprint templates.

Self-assemblable block copolymers are compounds useful in nanofabrication because they may undergo an order-disorder transition on cooling below a certain temperature (order-disorder transition temperature To/d) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have widths of the order of 1-5 nm and may be manipulated by modification of the chemical compositions of the blocks of the copolymers.

The feasibility of using thin films of block copolymers as self-assembling templates was demonstrated by Chaikin and Register, et al., Science 276, 1401 (1997). Dense arrays of dots and holes with dimensions of 20 nm were transferred from a thin film of poly(styrene-block-isoprene) to silicon nitride substrates.

SUMMARY

Block copolymers comprise different blocks, each comprising identical monomers, arranged side-by side along the polymer chain. Each block may contain many monomers of its respective type. So, for instance, an A-B block copolymer may have a plurality of type A monomers in the (or each) A block and a plurality of type B monomers in the (or each) B block. An example of a suitable block copolymer is, for instance, a polymer having covalently linked blocks of polystyrene monomer (hydrophobic block) and polymethylmethacrylate (PMMA) monomer (hydrophilic block). Other block copolymers with blocks of differing lyophobicity/lyophilicity may be useful. For instance a tri-block copolymer (A-B-C) may be useful, as may an alternating or periodic block copolymer (e.g. $[-A-B-A-B-A-B-]_n$ or $[-A-B-C-A-B-C]_m$ where n and m are integers). The blocks are connected to each other by covalent links in a linear or branched fashion (e.g. star or branched configuration).

Block copolymers may form many different phases upon self-assembly, dependent upon the volume fractions of the blocks, degree of polymerization within each block type (i.e. number of monomers of each respective type within each respective block), the optional use of solvents and surface interactions. When applied in a thin film, the geometric confinement may pose additional boundary conditions that may limit the numbers of phases. In general only spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled block copolymers, and the phase type observed may depend upon the relative volume fractions of the different polymer blocks.

Suitable block copolymers for use as self-assemblable polymers include, but are not limited to, poly(styrene-block-methylmethacrylate), poly(styrene-block-2-vinylpyrididne), poly(styrene-block-butadiene), poly(styrene-block-ferrocenyldimethylsilane), poly(styrene-block-ethylenoxide), poly(ethyleeneoxide-block-isoprene). Although these are di-block copolymers as examples, it will be apparent to that self-assembly may also employ tri-block, tetrablock or other multi-block copolymers.

The self-assembled block copolymer phases may orient with symmetry axes parallel or perpendicular to the substrate and lamellar and cylindrical phases are most interesting for lithography applications, as they may form line and spacer patterns and hole arrays, respectively, and may provide good contrast when one of the domain types is subsequently etched.

Two methods used to guide self-assembly of block copolymers onto surfaces are graphoepitaxy and chemical pre-patterning. In the graphoepitaxy method, self-organization of a block copolymer is guided by topological pre-patterning of the substrate. A self-aligned block copolymer can form parallel linear patterns with adjacent lines of the different polymer block domains in the trenches defined by the patterned substrate. For instance if the block copolymer is a di-block copolymer with A and B blocks within the polymer chain, where A is lyophilic and B is lyophobic in nature, the A blocks may assemble into domains formed adjacent to a side-wall of a trench if the side-wall is also lyophilic in nature. Resolution may be improved over the resolution of the patterned substrate by the block copolymer pattern subdividing the spacing of pre-patterns on the substrate.

In the chemical pre-patterning method, the self-assembly of block copolymer domains is guided by chemical patterns on the substrate. Chemical affinity between the chemical patterns and at least one of the types of copolymer blocks within the polymer chain may result in the precise placement of one of the domain types onto a corresponding region of the chemical pattern on the substrate. For instance if the block copolymer is a di-block copolymer with A and B blocks, where A is lyophilic and B is lyophobic in nature, and the chemical pattern comprises lyophobic regions on a lyophilic surface, the B domains may preferentially assemble onto the lyophobic regions. As with the graphoepitaxy method of alignment, the resolution may be improved over the resolution of the patterned substrate by the block copolymer pattern subdividing the spacing of the pre-patterned features on the substrate (so-called density multiplication). Chemical pre-patterning is not limited to a linear pre-pattern; for instance the pre-pattern may be in the form of a 2-D array of dots suitable as a pattern for use with a cylindrical phase-forming block copolymer. Graphoepitaxy and chemical pre-patterning may be used, for instance, to guide the self-organization of lamellar or cylindrical phases.

In a typical process to implement the use of block copolymer self-assembly in nanofabrication, a substrate may be modified with an orientation control layer, or primer layer, to induce the preferred orientation of the self-assembly pattern in relation to the substrate. For some block copolymers used in self-assemblable polymer layers, there may be a preferential interaction between one of the blocks and the substrate surface that may result in orientation. For instance, for a polystyrene/PMMA block copolymer, the PMMA block will preferentially wet (i.e. have a high chemical affinity with) an oxide surface and this may be used to induce the self-assembled pattern to lie oriented parallel to the plane of the surface.

Perpendicular orientation may be induced, for instance, by rendering the substrate surface neutral to both blocks, in other words having a similar chemical affinity for each block, such that both blocks wet the surface in a similar manner. A neutral surface may be created by use of random copolymer brushes which are covalently linked to the substrate by reaction of a hydroxyl terminal group, or some other reactive end group, to oxide at the substrate surface. Alternatively or additionally, a crosslinkable random copolymer or an appropriate silane can be used to render a surface neutral by acting as an intermediate layer between the substrate surface and the layer of self-assemblable polymer. An intermediate layer between the substrate and the layer of self-assemblable block polymer, onto which the self-assemblable block polymer layer is directly deposited, is referred to hereinafter as a primer layer. The primer layer may be provided with one or more gaps to permit one of the block types of the self-assemblable layer to come into direct contact with the substrate below the primer layer. This may be useful for anchoring or aligning a domain of a particular block type of the self-assemblable polymer layer to the substrate.

The substrate may be further provided with a topological or chemical pre-pattern as set out above to guide the self-assembly pattern. A thin layer of self-assemblable block copolymer is typically deposited on the substrate, typically onto an intermediate neutral or primer layer as set out above. A suitable method for deposition is spin coating as it is capable of providing a well defined, uniform, thin layer. A suitable layer thickness for a deposited block copolymer film is approximately 10 to 100 nm. Following deposition of the block copolymer film, the film may still be disordered or only partially ordered and additional steps may be needed to promote and/or complete self-assembly.

The block copolymer is self-assembled into a highly ordered regular pattern. The self-assembly process typically occurs most readily at a temperature above the glass-transition temperature and below the order-disorder temperature for the block copolymer. This stage is referred to as ordering, and is generally achieved by uniform heating. The self-assembly process may nucleate at multiple points in the block copolymer film and this may result in the formation of defects.

Defects formed during ordering as set out above may be partly removed by annealing. Defects such as disclinations (which are line defects in which rotational symmetry is violated, e.g. where there is a defect in the orientation of a director) may be annihilated by pairing with other defects or disclinations of opposite sign. Chain mobility of the block copolymer may be a crucial factor for determining defect migration and annihilation and so annealing may be carried out at a temperature where chain mobility is high but the self-assembled ordered pattern is not lost. This implies a temperature up to a few ° C. above or below the order/disorder temperature To/d for the polymer. Unfortunately, some isolated defects are hard to annihilate. They have a high immobility which may be attributable to high energy input required to restructure the ordered surroundings of such defects.

The ordering and defect annihilation may be combined into a single annealing process.

Although the techniques set out above for applying a block copolymer self-assembled layer to a surface provide partial alignment of the block copolymer structure on a surface, the resulting self-assembled layer may have a high level of incorrectly aligned polymer molecules, leading to defects in the resulting self-assembled layer.

A layer of self-assembled block copolymer, after directed ordering and defect reduction through annealing, may exhibit a defect rate of 1 in $10^3$ to 1 in $10^4$, expressed as the number of non-functional features of a multi-component device derived from the self-assembled layer (see, for example, Yang et. al, ACS Nano, 2009, 3, 1844-1858).

Self-assembly of a block copolymer is a process where the assembly of many small components (of the block copolymer) results in the formation of a larger more complex structure (the nanometer sized features in the self-assembly pattern, referred to as domains in this specification) and the defects arise naturally from the physics controlling the self-assembly of the polymer. Self-assembly is driven by the differences in interactions (i.e. differences in mutual chemical affinity) between A/A, B/B and A/B (or B/A) block pairs of an A-B block copolymer, with the driving force for phase separation described by Flory-Huggins theory for the system under consideration.

For a block copolymer which undergoes self-assembly, the block copolymer will exhibit an order-disorder temperature To/d. To/d may be measured by any suitable technique for assessing the ordered/disordered state of the polymer, such as differential scanning calorimetry (DSC). If layer formation takes place below this temperature, the molecules will be driven to self-assemble. Above the temperature To/d, a disordered layer will be formed with the entropy contribution from disordered A/B domains outweighing the enthalpy contribution arising from favorable interactions between neighboring A-A and B-B block pairs in the layer. The block copolymer may also exhibit a glass transition temperature Tg below which the polymer is effectively immobilized and above which the copolymer molecules may still reorient within a layer relative to neighboring copolymer molecules. The glass transition temperature is suitably measured by differential scanning calorimetry (DSC).

If To/d is less than Tg for the block copolymer, then a self-assembled layer will be unlikely to form or will be highly defected because of the inability of the molecules to align correctly when below To/d and below Tg. A desirable block copolymer for self-assembly has To/d higher than Tg. However, once the molecules have assembled into a solid-like layer, even when annealed at a temperature above Tg but below To/d, the mobility of the polymer molecules may be insufficient to provide adequate defect removal by annealing. Multiple annealing may be carried out to give improvements in defect levels, but this may take considerable time. Another option is to anneal the layer just above To/d to provide sufficient mobility to the polymer molecules to remove defects. However, annealing at a temperature far above To/d or for a too long period may result in disordering of the film. A typical way of annealing above To/d is by sequential temperature cycles just above and below To/d, for instance up to a few ° C. such as 5° C. above or below To/d.

The thermodynamics of polymer self-assembly is predominantly governed by the immiscibility of the different blocks as described in Flory-Huggins theory. Whether or not a polymer will exhibit self-assembly into nanoscale patterns is characterized by the product $\chi N$, in which $\chi$ is the Flory-Huggins interaction parameter and N is the total degree of polymerization.

Mean field theory calculations indicate that an order-disorder transition should occur for $\chi N=10.5$ for symmetrical block copolymers, which implies that the minimum total degree of polymerization required to give phase segregation for a class of block copolymers is dependent upon the Flory-Huggins parameter for this block copolymer at the annealing temperature following the relationship $N=10.5/\chi$. It should be understood that the value of 10.5 is not to be taken as a threshold, but rather it indicates a region above or below which ordering or disordering may take place. When $\chi N$ is less than about 10.5 the block copolymer will not generally exhibit self-assembly behavior and the resulting polymer film will be in a disordered, high entropy state. For $\chi N$ greater than about 10.5, the block copolymer may show strong segregation of the block domains and the polymer may self-assemble into regular patterns with sharp interfaces between adjacent domains of differing block types.

For block copolymers with $\chi N$ greater than 10.5, self-assembled pattern formation occurs when a thin film sample is brought to a temperature sufficiently above the glass transition temperature of the copolymer to provide reasonable polymer mobility, but below To/d for the polymer, to allow nano-phase separation and pattern formation.

The degree of polymerization N is directly related to the minimum characteristic domain length scale, $L_0$, attainable for a specific block copolymer. Typically $L_0=N^\delta$, where $\delta$ can vary from 0.5 to 1.0 depending on whether the polymer exhibits strong or weak segregation. $L_0$ gives an indication of the smallest feature sizes derivable for the self-assembled polymer.

The line edge roughness, LER, and line width roughness, LWR, of self-assembled features for a self-assemblable polymer, such as a block copolymer, are governed by polydispersity of the block copolymer and by the interfacial width between polymer blocks at the domain boundaries between adjacent domains of differing block type. The interfacial width is given by the relationship $\delta\infty=2a/\sqrt{6\chi}$.

The LWR is typically related to LER for a self-assembled polymer by the relationship $LWR=\sqrt{2}\ LER$.

Hence, the LWR and LER are inversely proportional to the Flory-Huggins parameter $\chi$, and so it is desirable that $\chi$ is as large as possible when the self-assembled polymer is fixed in its structure (for instance when the self-assembled polymer is solidified by reducing its temperature to a temperature below the glass transition temperature Tg for the polymer) so that LWR/LER are as small as possible.

Limited pattern persistence length and high defect densities limit the usefulness of a self-assemblable polymer, such as a block copolymer, for use in the semiconductor industry. Both the pattern persistence length of an ordered polymer layer and its defect density may be influenced by the value of the Flory-Huggins parameter at the temperature at which the ordered polymer layer is formed or annealed (i.e. at temperatures at or around To/d for the polymer). Persistence length is a measure of the ability to maintain coherence of periodicity over long distances.

A high Flory-Huggins parameter at Tg for the polymer is beneficial for LWR/LER, pattern persistence length and low defect density. However to realize these beneficial effects, the polymer chains should have the kinetic freedom and mobility to self-order and annihilate defects. To achieve this, the ordered layer should be annealed at a temperature close to To/d. Block copolymers used for self-assembly which have a high value of Flory-Huggins parameter at Tg also have a very high order/disorder temperature because of the weak temperature dependence of the Flory-Huggins parameter for a conventional self-assemblable polymer.

For a self-assembled pattern having very low values for LWR/LER, it may be necessary for To/d to be above the decomposition temperature of the polymer, or at least at a temperature sufficiently high to be incompatible with semiconductor processing. Because of thermal constraints imposed by the other materials making up device substrates, annealing may be limited to temperatures up to 250° C. Hence, such polymers may not be annealed at temperatures around their To/d value, which may be in excess of 250° C.

Hence, self-assemblable polymers may need to be used which have To/d less than say 250° C., and this could lead to large values for LWR/LER in ordered patterns formed from such polymers.

Accordingly, it is desirable to modify the To/d of a self-assemblable polymer to occur at a lower temperature while maintaining a high Flory-Huggins parameter at Tg for the polymer. This would enable annealing at a temperature close to To/d for the polymer while avoiding a high temperature (say greater than 250° C.) which may cause damage to a device substrate. Further, this should provide improved LWR/LER.

A high value for the Flory Huggins parameter $\chi$ at the annealing temperature strongly inhibits inter-diffusion of polymer blocks of differing types, and so hinders the processes leading to defect annihilation and pairing, but a high value of $\chi$ is desirable to give low line edge and line width roughness.

Expressed more simply, using the example of an A-B block copolymer as the self-assemblable polymer, if the blocks are highly chemically incompatible, the LWR/LER will be good (small in value) for the assembled polymer and low levels of defects and a good persistence length may be expected when the block copolymer layer is in thermodynamic equilibrium. However, in practice, such thermodynamic equilibrium may not be reached due to low polymer chain mobility and inhibited interdiffusion of polymer blocks which may arise from the chemical incompatibility of the blocks. As result, the levels of defects may be significantly higher, and persistence length may be poorer, than their theoretically attainable values at equilibrium. If the blocks are relatively chemically compatible, but just sufficiently incompatible for self-assembly to occur at low To/d, then LWR and LER may be unacceptably large and persistence length may be poor and defect levels high.

For a polymer having a particular N value, the value of the Flory-Huggins parameter at or around To/d will determine the kinetics of ordering and the time taken to reach thermodynamic equilibrium, whereas the value of the Flory Huggins parameter at Tg, when in equilibrium, will determine the defect level, persistence length and LWR/LER behavior. It is to be assumed that the LWR/LER will be frozen in place in the ordered layer once the polymer temperature falls below Tg.

Typically, for a self-assemblable polymer, the Flory-Huggins parameter is not highly dependent upon temperature. For example, a commonly used block copolymer poly(styrene-block-methylmethacrylate) (PS-block-PMMA) shows only very limited temperature dependence: $\chi=0.028+3.9/T$. The values at 20° C. (273K) and at a typical anneal temperature of 180° C. differ only by about 10%.

Hence, it is desirable, for example, to provide a method and compound which tackles one or more problems in the art regarding high defect levels and/or low persistence lengths for self-assembled polymer layers, in combination with providing improvements in line width roughness and/or line edge roughness in a patterned layer formed from a self-assembled polymer. For instance it is desirable to provide a method and compound which allows for improvement in defect levels and/or in persistence length and/or which provide reduction in defect levels and/or enhancement of persistence length in shorter times, and/or which allow for formation of a self-assembled polymer layer containing low defect levels and/or with high persistence length, while also providing substantially no increase in line width or edge roughness or while providing reduction in line width or edge roughness. It is also desirable, for example, to improve (reduce) line width/edge roughness without any substantial increase in defects or reduction in persistence length.

Accordingly, there is provided, for example, a method and compound useful for providing a self-assembled layer of block copolymer, suitable for use in device lithography, which provides reduced defect levels and/or improved persistence length without substantial reduction in line width/edge roughness. Accordingly, there is provided, for example, a method and composition which provides reduction in line width/edge roughness without substantial increase in defect levels and/or without substantial reduction of persistence length in a self-assembled layer. Accordingly, there is provided, for example, a compound and method which provides a self-assemblable polymer which is more readily annealed to remove defects and to improve persistence length of patterned structures while also providing low line edge/width roughness. Accordingly, there is provided, for example, a self-assemblable polymer with a low value for its order/disorder transition temperature To/d which also exhibits low line edge roughness/line width roughness when self-assembled in an ordered pattern.

Throughout this specification, the term "comprising" or "comprises" means including the component(s) specified but not to the exclusion the presence of others. The term "consisting essentially of" or "consists essentially of" means including the components specified but excludes other components except for materials present as impurities, unavoidable materials present as a result of processes used to provide the components, and components added for a purpose other than achieving the technical effect of the invention. Typically, a composition consisting essentially of a set of components will comprise less than 5% by weight, typically less than 1% by weight of non-specified components.

Whenever appropriate, the use of the term "comprises" or "comprising" may also be taken to include the meaning "consists essentially of" or "consisting essentially of".

An aspect of the invention provides a self-assemblable polymer having first and second molecular configurations wherein the first molecular configuration has a higher Flory Huggins parameter for the self-assemblable polymer than the second molecular configuration, and wherein the self-assemblable polymer is configurable from the first molecular configuration to the second molecular configuration, from the second molecular configuration to the first molecular configuration, or both, by the application of a stimulus.

The following features are applicable to all the various aspects of the compounds and methods described herein where appropriate. When suitable, combinations of the following features may be employed as part of the methods and compositions described herein, for instance as set out in the claims. The methods and compositions described herein are particularly suitable for use in device lithography. For instance the methods and compositions may be used for treatment or formation of a resist layer of self-assembled polymer for use in patterning a device substrate directly or for use in patterning an imprint template for use in imprint lithography.

The self-assemblable polymer may be a block copolymer as set out hereinbefore comprising at least two different block types which are self-assemblable into an ordered polymer layer having the different block types associated into first and second domain types. The block copolymer may be a di-block copolymer or a tri-block or multi-block copolymer. An alternating or periodic block copolymer may be used as the self-assemblable polymer.

The self-assemblable polymer may be a block copolymer comprising one or more first blocks of first monomers and one or more second blocks of second monomers, wherein the first molecular configuration and second molecular configuration have the first monomers in first and second molecular arrangements respectively.

The second monomers may have substantially unchanged molecular arrangements in the first and second molecular configurations. Alternatively, the second monomers may have differing molecular arrangements in the first and second molecular configurations.

The first monomers, when in the first molecular arrangement, desirably have a lower chemical affinity for the second monomers than the first monomers when in the second molecular arrangement. By chemical affinity, in this specification, is meant the tendency of two differing chemical species to associate together. For instance a chemical species which is lyophilic (e.g., hydrophilic) in nature has a high chemical affinity for a particular liquid (e.g., water) whereas a lyophobic (e.g., hydrophobic) compound has a low chemical affinity for the particular liquid (e.g., water) but a high chemical affinity for, e.g., an alkane. Chemical species which are polar in nature have a high chemical affinity for other polar compounds and for water whereas apolar, non-polar or lyophobic compounds have a low chemical affinity for water and polar species but may exhibit high chemical affinity for other non-polar species such as an alkane or the like. The chemical affinity is related to the free energy associated with an interface between two chemical species: if the interfacial free energy is high, then the two species have a low chemical affinity for each other whereas if the interfacial free energy is low, then the two species have a high chemical affinity for each other.

By "chemical species" in this specification is meant either a chemical compound such as a molecule, oligomer or polymer, or, in the case of an amphiphilic molecule (i.e. a molecule having at least two interconnected moieties having differing chemical affinities), the term "chemical species" may refer to the different moieties of such molecules. For instance, in the case of a di-block copolymer, the two different polymer blocks making up the block copolymer molecule are considered as two different chemical species having differing chemical affinities.

The terms "molecular configuration" and "molecular arrangement" as used in this specification are meant to be synonymous (the different terms are used for clarity reasons only) and refer to the physical, spatial, isomer and/or electron arrangements of a chemical species. For instance, a zwitterionic or amphoteric chemical species may exhibit one molecular configuration or arrangement which is polar and another arrangement which is substantially apolar. For instance a chemical species such as polyoxyethylene or polyoxypropylene may exhibit a different molecular configuration depending upon whether it is in hydrated or substantially dehydrated states.

The first monomers may have differing polarities in the first and second molecular arrangements. For instance, the first monomers may have one (first or second) molecular arrangement that is neutral, non-ionic or non-polar in nature and another (second or first) molecular arrangement that exhibits charge separation within the monomer (i.e. zwitterionic behavior).

Additionally, or alternatively, the first monomers may have differing physical conformations in the first and second molecular arrangements. For instance, if a cyclic moiety is present, one molecular arrangement may have a "boat" configuration with the other molecular arrangement having a "chair" configuration. For instance, one molecular arrangement may have a cis-arrangement about a carbon-carbon double bond with another molecular arrangement having a trans-arrangement about the same bond.

Additionally, or alternatively, the first monomers may have differing hydration states in the first and second molecular arrangements. For instance some monomers, such as polyethylene oxides or polypropylene oxides, may exhibit a lower critical solution temperature (LCST) in the presence of water, so that the monomers are hydrated or water-soluble below the LSCT but adopt a dehydrated molecular configuration above the LCST.

The stimulus, applied for configuring the self-assemblable polymer from the first molecular configuration to the second molecular configuration, from the second molecular configuration to the first molecular configuration, or both, may comprise actinic radiation such as visible or ultraviolet radiation.

The stimulus may additionally or alternatively comprise temperature. Other suitable stimulus may be used additionally or alternatively, for instance a chemical stimulus such as humidity or pH.

It may be that the transition from one molecular configuration to another molecular configuration is reversible without application of a further stimulus, or with no stimulus other than reducing the temperature of the self-assemblable polymer after an ordered layer has been formed, or it may be that a second stimulus must be applied to return the self-assemblable polymer to its first molecular configuration after a first stimulus has been used to take the polymer from its first to its second molecular configuration.

When the stimulus used to effect the change in molecular configuration is temperature, it may be that there is a configuration transition temperature Tc, the self-assemblable polymer exhibiting the first molecular configuration at temperatures below Tc and exhibiting the second molecular configuration at temperatures above Tc. In such cases, the temperature Tc is suitably greater than Tg and less than To/d, for instance so that the self-assemblable polymer exhibits a Flory Huggins parameter having a value at To/d which is substantially lower than its value at Tg as a result of the differing molecular configurations of the polymer at the different temperatures. Alternatively, the change from first to second molecular configuration may take effect over a range of temperatures rather than exhibiting a transition temperature. The effect of this is that the To/d is lower for the second molecular configuration than it would be if the molecular configuration remained as the first molecular configuration.

The self-assemblable polymer may have a glass transition temperature Tg and an order/disorder transition temperature To/d, wherein the Flory Huggins parameter for the self-assemblable polymer in the first molecular configuration at the glass transition temperature Tg is at least 1.2 times, at least 2 times, or at least 3 times the Flory Huggins parameter for the self-assemblable polymer in the second molecular configuration at the order/disorder transition temperature To/d for the self-assemblable polymer when in the second molecular configuration.

The glass transition temperature is suitably measured by differential scanning calorimetry (DSC), as is the order/disorder transition temperature To/d.

In an aspect of the invention, the self-assemblable polymer may be a block copolymer comprising first blocks of first monomers and second blocks of second monomers, the block copolymer having first and second molecular configurations, wherein the first molecular configuration has the first monomers in a first molecular arrangement, wherein the second molecular configuration has the first monomers in a second molecular arrangement, wherein the self-assemblable polymer is configurable from the first molecular configuration to the second molecular configuration, from the second molecular configuration to the first molecular configuration, or both, by the application of a stimulus, and wherein the first monomers when in the first molecular arrangement have a lower chemical affinity for the second monomers than the first monomers when in the second molecular arrangement.

In other words, when the self-assemblable polymer is in the second molecular configuration, the chemical affinities of the first and second blocks of first and second monomers respectively are such that self-assembly will take place provided that the temperature is less than To/d for the self-assemblable polymer in the second molecular configuration, but the difference in chemical affinities is not so great that re-ordering of the polymer molecules to eliminate defects is completely hindered. When the self-assemblable polymer is in the first molecular configuration for instance at a temperature just above Tg, the chemical affinities of the first and second blocks of first and second monomers respectively are such that there is a large difference in chemical affinity so that there will be a well-ordered boundary between domains of the first and second monomers in the ordered layer, yielding an ordered layer with a low boundary edge roughness.

An aspect of the invention provides a method for providing an ordered layer of self-assemblable polymer on a substrate, the self-assemblable polymer having a first molecular configuration when assembled in the ordered layer, the method comprising:

providing a layer of a self-assemblable polymer on the substrate, heating the self-assemblable polymer to a first temperature $T_1$ above its glass transition temperature Tg, with the self-assemblable polymer configured into a second molecular configuration, wherein the first temperature $T_1$ is below an order/disorder transition temperature To/d for the self-assemblable polymer in the second molecular configuration, and the self-assemblable polymer assembles to provide the ordered polymer layer, returning the self-assemblable polymer to its first molecular configuration, and cooling the self-assemblable polymer to a temperature below its glass transition temperature Tg, wherein the first molecular configuration provides a higher Flory Huggins parameter for the self-assemblable polymer than the second molecular configuration.

An aspect of the invention provides a method for providing an ordered layer of self-assemblable polymer on a substrate, wherein the self-assemblable polymer is a block copolymer comprising first blocks of first monomers and second blocks of second monomers, the block copolymer having first and second molecular configurations, wherein the first molecular configuration has the first monomers in a first molecular arrangement and the second molecular configuration has the first monomers in a second molecular arrangement, wherein the first monomers when in the first molecular arrangement have a lower chemical affinity for the second monomers than the first monomers when in the second molecular arrangement, and wherein the self-assemblable polymer has the first molecular configuration in the ordered layer, the method comprising:

providing a layer of the self-assemblable polymer on the substrate, heating the self-assemblable polymer to a first temperature $T_1$ above its glass transition temperature Tg, with the self-assemblable polymer configured into the second molecular configuration, wherein the first temperature $T_1$ is below an order/disorder transition temperature To/d for the self-assemblable polymer in the second molecular configuration, and the self-assemblable polymer assembles to provide the ordered polymer layer, returning the self-assemblable polymer to its first molecular configuration, and cooling the self-assemblable polymer to a temperature below its glass transition temperature Tg.

The self-assemblable polymer is suitably configurable from the first molecular configuration to the second molecular configuration, from the second molecular configuration to the first molecular configuration, or both, by the application of a stimulus. As set out hereinbefore, the stimulus may comprise actinic radiation such as visible or ultraviolet radiation and/or temperature. Other suitable stimulus may be used, additionally or alternatively, for instance a chemical stimulus such as humidity or pH. A chemical stimulus may be applied by contacting the layer with a liquid, vapor or gas.

The methods may further comprise heating the self-assemblable polymer layer to a second temperature $T_2$ while the self-assemblable polymer is in the second molecular configuration, wherein the second temperature $T_2$ is greater than the order/disorder transition temperature To/d in the second molecular configuration.

The self-assemblable polymer layer may be annealed by varying its temperature in the range between the first temperature $T_1$ and the second temperature $T_2$ prior to returning the self-assemblable polymer to its first molecular configuration, and prior to cooling the self-assemblable polymer to a temperature below its glass transition temperature Tg.

The self-assemblable polymer may be annealed by applying a stimulus to alternate the self-assemblable polymer between its second molecular configuration and its first molecular configuration at the second temperature $T_2$ (i.e. at a temperature above To/d for the self-assemblable polymer in the second molecular configuration) prior to cooling the self-assemblable polymer in its first molecular configuration to a temperature below its glass transition temperature Tg, wherein $T_2$ is less than To/d for the polymer when in the first molecular configuration.

At the temperature $T_2$, the polymer will be above To/d for the second molecular configuration but below To/d for the first molecular configuration, and so application of a stimulus to alternate the polymer from one molecular configuration to the other will have a defect annealing effect. For instance, the polymer may be heated to $T_2$ while in the first molecular configuration, so that it is below To/d for the first molecular configuration, then a stimulus is applied to switch the polymer into its second molecular configuration, with $T_2$ being greater than To/d for the second molecular configuration. The polymer may be switched back and forth between the two configurations while at $T_2$ by suitable application of a stimulus.

An aspect of the invention provides a lithography method for patterning a surface of a substrate by resist etching, wherein the method comprises providing an ordered layer of self-assemblable polymer at the surface by a method described herein, wherein the ordered layer acts as a resist layer.

For instance, the different blocks of the ordered polymer may each exhibit different etch resistivity. Alternatively, one of the blocks may be selectively removed e.g. by photo-degradation and the remaining block may serve as an etch resist.

BRIEF DESCRIPTION OF THE DRAWINGS

Specific embodiments of the invention will be described with reference to the accompanying figures, in which.

DETAILED DESCRIPTION

Figure 1A:
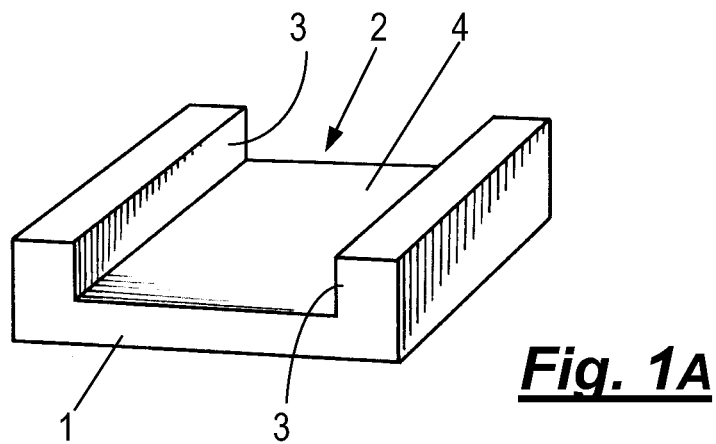
FIGS. 1A to 1C schematically depict directed self-assembly of A-B block copolymers onto a substrate by graphoepitaxy and formation of relief patterns by selective etching of one domain.
Figure 1B:
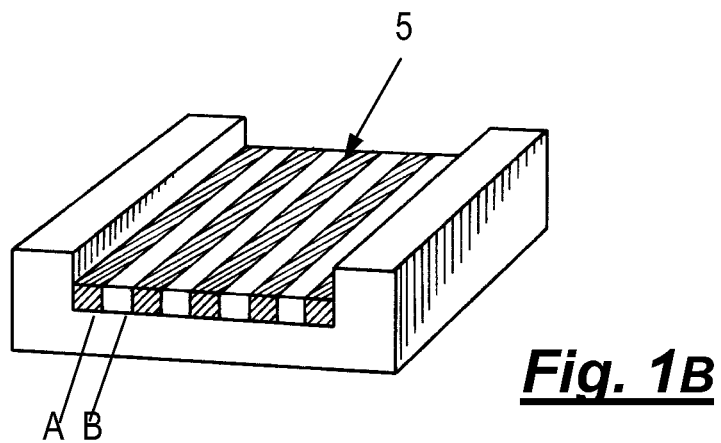
Figure 1C:
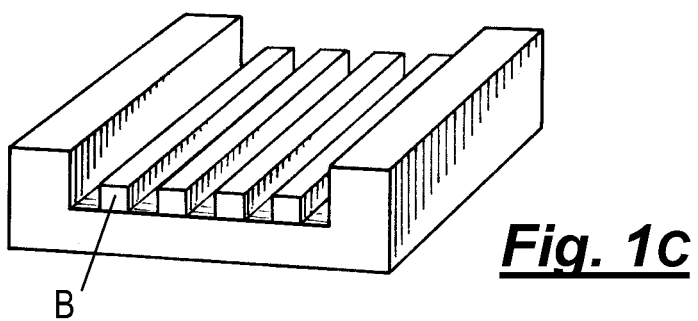

FIG. 1A shows a substrate 1 with a trench 2 formed therein bounded by one or more side walls 3 and a bottom surface 4. In FIG. 1B, a self-assemblable A-B block copolymer with lyophilic A blocks and lyophobic B blocks has been deposited into the trench to form a layer 5 with alternating stripes of A and B domains which have deposited as a lamellar phase separated into discrete micro-separated periodic domains during deposition of the block copolymer. This is referred to as graphoepitaxy. The type A domains have nucleated adjacent to the side wall 3, which is also lyophilic. In FIG. 1C, the type A domains have been removed by selective chemical etching, leaving the type B domains to form a relief pattern in the trench where they may serve as a template for subsequent patterning of the bottom surface 4, for instance by chemical etching. Selective removal may be achieved, for instance, by selective photodegradation or photo-cleavage of a linking agent between blocks of the copolymer and subsequent solubilization of one of the blocks. The pitch or wavelength of the self-assembled polymer structure 5 and the width of the trench 4 are arranged so that a number of alternating stripes of domains can fit into the trench with a type A domain against each or the side wall.

Figure 2A:
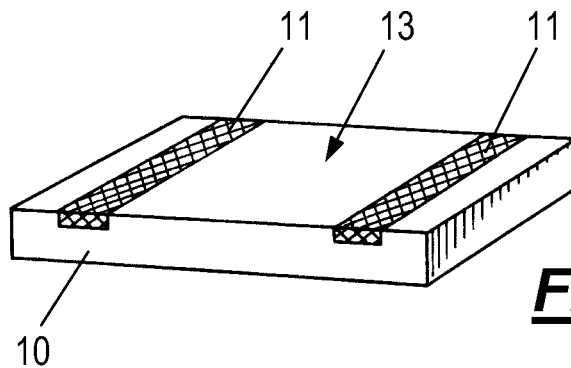
FIGS. 2A to 2C schematically depict directed self-assembly of A-B block copolymers onto a substrate by chemical pre-patterning and formation of relief patterns by selective etching of one domain.
Figure 2B:
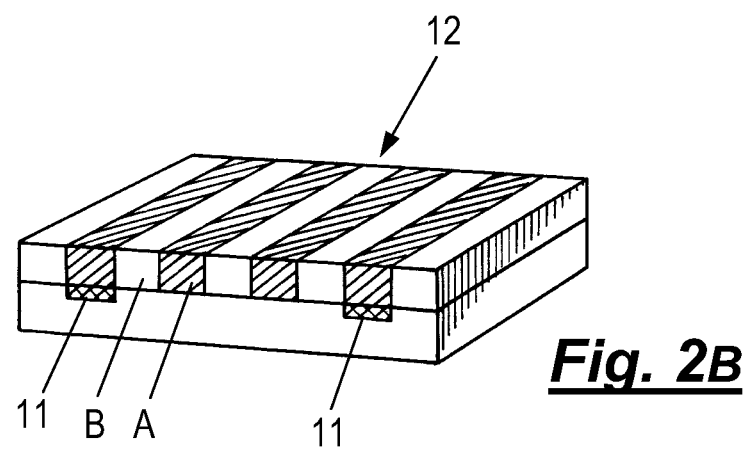
Figure 2C:
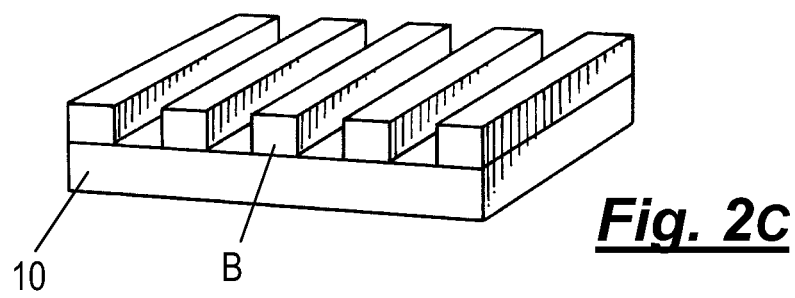

FIG. 2A shows a substrate 10 with a chemical pattern in the form of pinning stripes 11 which have been chemically formed on the surface 13 to provide regions with a higher affinity for the type A blocks of the polymer. In FIG. 2B, a self-assemblable A-B block copolymer with lyophilic A blocks and lyophobic B blocks has been deposited onto the surface 13 of substrate 10 to form a lamellar phase layer 12 with alternating stripes of A and B domains which have phase separated into discrete micro-separated periodic domains during deposition of the block copolymer. This is referred to as chemical pre-patterning. The type A lyophilic domains have nucleated atop the pinning stripes 11, which are also lyophilic. In FIG. 2C, the type A domains have been removed by selective chemical etching, leaving the type B domains to form a relief pattern on the surface 13 where they may serve as a template for subsequent patterning of surface 13, for instance by chemical etching. The pitch or wavelength of the self-assembled polymer structure 12 and the spacing of the pinning stripes 11 are arranged so that a number of alternating stripes of domains can fit between the pinning stripes 11 with a type A domain atop each pinning stripe 11.

Figure 3A:
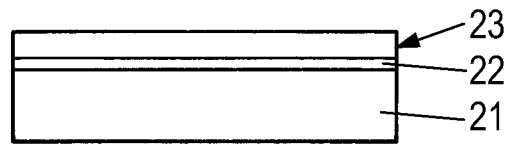
FIGS. 3A to 3D schematically depict a method according to an embodiment of the invention.

Turning to FIGS. 3A to 3D, these show a schematic depiction of a method according to an embodiment of the invention. FIG. 3A shows a substrate 21 provided with a primer layer 22 upon which is deposited a layer of self-assemblable polymer 23 which is an A-B block copolymer in a disordered state (i.e. not yet an ordered layer in which the polymer has self-assembled to give a periodically patterned ordered layer).

The primer layer 22 in this embodiment is of random copolymer brushes which are covalently linked to the substrate by reaction of a hydroxyl terminal group, or some other reactive end group, to oxide at the substrate surface. This renders the surface neutral in chemical affinity to A or to B by acting as an intermediate layer between the substrate surface and the layer of self-assemblable polymer. The primer layer may be provided with gaps (not illustrated in the Figures) to permit one of the block types of the self-assemblable layer to come into direct contact with the substrate 21 below the primer layer 22. This may be useful for anchoring or aligning a domain of a particular block type of the self-assemblable polymer layer 23 to the substrate 21.

Figure 3B:
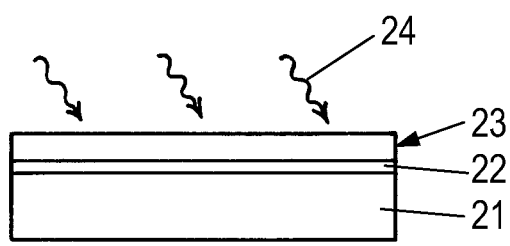

The A block of the copolymer is of monomers comprising azobenzene moieties which have a low energy trans- and a high energy cis-isomeric state. The trans-isomer may be converted to the cis-isomer by irradiation with an appropriate first wavelength of radiation and converted back to the trans-isomer by illumination with a different, second wavelength of radiation. In FIG. 3B, the polymer layer 23 is subjected to radiation 24 such that the monomers of the A blocks are converted into the cis-form. The monomers of B are such that the monomers of A, when in the cis-form have a greater chemical affinity for the monomers of B than when they are in the trans-form, and so the Flory-Huggins parameter for the self-assemblable polymer is greatly reduced when the A monomers are in the cis-arrangement (second molecular arrangement) rather than in the trans-arrangement (first molecular arrangement).

Figure 3C:
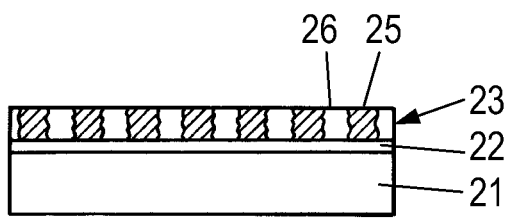

With the A monomers in the cis-arrangement, the self-assemblable polymer is heated to a temperature above its glass transition temperature Tg but below its order/disorder transition temperature To/d so that the polymer layer 23 may self-assemble into domains of type A 25 and type B 26 providing a periodic, patterned layer. This is shown in FIG. 3C.

The polymer layer 23 may be annealed to remove defects and to improve its persistence length while the A monomers are in the cis-configuration by varying the temperature, for instance in the range between a first temperature $T_1$ and a second temperature $T_2$, wherein $T_1$ is a temperature a few degrees C. below To/d and $T_2$ is a temperature a few degrees C. above To/d.

Figure 3D:
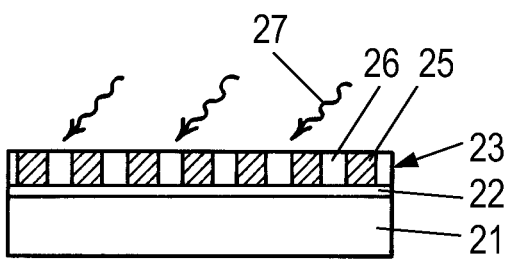

In FIG. 3D, the self-assemblable polymer layer 23 is returned to its first molecular configuration, by returning the A monomers to their trans-arrangement (first molecular arrangement) by illumination with radiation of a suitable second wavelength 27 to effect the transition from cis- to trans-. This ensures that the A and B monomers now have less chemical affinity for each other and so clear boundaries are formed between the A and B domains 25, 26 prior to cooling the self-assemblable polymer layer 23 to a temperature below its glass transition temperature Tg whereby the pattern is fixed into the self-assemblable polymer layer 23.

The ordered layer of the embodiment will have low defect levels and high persistence length as a result of the annealing carried out with the polymer layer 23 in its second molecular configuration while the polymer molecules are more capable of inter-diffusion and mobility relative to each other. However, the large line width/edge roughness associated with such a low Flory Huggins parameter is avoided, for the set, ordered layer, by converting the polymer layer 23 into its first molecular configuration prior to taking the temperature below Tg for the polymer in its first molecular configuration. The low chemical affinity between the different domain types A 25 and B 26 in this first molecular configuration results in well-defined boundaries between the different domains.

The described and illustrated embodiment is to be considered as illustrative and not restrictive in character, it being understood that only a preferred embodiment have been shown and described and that all changes and modifications that come within the scope of the inventions as defined in the claims are desired to be protected. For instance, instead of the self-assemblable polymer 23 using illumination with a second wavelength of radiation 27 to return it to the trans-configuration, it may simply return to that configuration as the self-assemblable polymer layer 23 is cooled to Tg.

For instance, the polymer may remain in the second molecular arrangement while a stimulus is applied and return to the first molecular arrangement once the stimulus is no longer applied. Other systems may be irreversible and so may require a second stimulus to be returned to the first molecular arrangement.

Other useful chemical moieties which may be employed to provide differing molecular arrangements when subjected to a stimulus include, in addition to azobenzenes, spiropyranes, spirooxazines, fulgides, binaphthyls and diarylethenes. These may, for instance, be included as substituents on the monomers of the self-assemblable polymer.

Other useful chemical moieties include polyalkoxy groups such as polyoxyethylene (polyethyleneglycol) or polyoxypropylene (polypropyleneglycol). These chemical moieties may exhibit differing molecular configurations arising from change in hydration state at a critical temperature.

Other useful chemical moieties are set out, for instance, in the article Thermo- and photo-responsive polymeric systems by Dai et. al. Soft Matter, 2009, 5, 2513-2533.

In an embodiment of the invention, the change from the first molecular configuration to the second molecular configuration arises solely as a result of thermal activation (i.e. is controlled solely by temperature). Hence, there may be a configuration transition temperature Tc, the self-assemblable polymer exhibiting the first molecular configuration at temperatures below Tc and exhibiting the second molecular configuration at temperatures above Tc. In such cases, the temperature Tc is suitably greater than Tg and less than To/d for the second molecular configuration, for instance so that the self-assemblable polymer exhibits a Flory Huggins parameter having a value at To/d which is greater than its value at Tg as a result of the differing molecular configurations of the polymer at the different temperatures.

The present invention relates to lithography methods. The methods may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. The invention is also of use to create regular nanostructures on a surface for use in the fabrication bit-patterned media or discrete track media for magnetic storage devices (e.g. for hard drives).

In particular, the invention is of use for high resolution lithography, where features patterned onto a substrate have a feature width or critical dimension of about 1 μm or less, typically 100 nm or less or even 10 nm or less.

Lithography may involve applying several patterns onto a substrate, the patterns being stacked on top of one another such that together they form a device such as an integrated circuit. Alignment of each pattern with a previously provided pattern is an important consideration. If patterns are not aligned with each other sufficiently accurately, then this may result in some electrical connections between layers not being made. This, in turn, may cause a device to be non-functional. Lithographic apparatus therefore usually includes an alignment apparatus, which may be used to align each pattern with a previously provided pattern, and/or with alignment marks provided on the substrate.

In this specification, the term "substrate" is meant to include any surface layers forming part of the substrate, or being provided on a substrate, such as planarisation layers or anti-reflection coating layers. The primer layer, as described in this specification, is not considered as part of the substrate, but is provided on the substrate. Nor is the self-assemblable polymer layer which is provided directly on the primer layer, considered as part of the substrate.

The invention claimed is:

1. A self-assemblable polymer having first and second molecular configurations wherein the first molecular configuration has a higher Flory Huggins parameter for the self-assemblable polymer than the second molecular configuration, and wherein the self-assemblable polymer is configurable from the first molecular configuration to the second molecular configuration, from the second molecular configuration to the first molecular configuration, or both, by the application of a stimulus.

2. The self-assemblable polymer according to claim 1 which is a block copolymer comprising one or more first blocks of first monomers and one or more second blocks of second monomers, wherein the first molecular configuration and second molecular configuration have the first monomers in first and second molecular arrangements respectively.

3. The self-assemblable polymer according to claim 2, wherein the second monomers have substantially unchanged molecular arrangements in the first and second molecular configurations.

4. The self-assemblable polymer according to claim 2, wherein the first monomers, when in the first molecular arrangement, have a lower chemical affinity for the second monomers than the first monomers when in the second molecular arrangement.

5. The self-assemblable polymer according to claim 2, wherein the first monomers have differing polarities in the first and second molecular arrangements.

6. The self-assemblable polymer according to claim 2, wherein the first monomers have differing physical conformations in the first and second molecular arrangements.

7. The self-assemblable polymer according to claim 2, wherein the first monomers have differing hydration states in the first and second molecular arrangements.

8. The self-assemblable polymer according to claim 1, wherein the stimulus comprises actinic radiation.

9. The self-assemblable polymer according to claim 1, wherein the stimulus comprises temperature.

10. The self-assemblable polymer according to claim 9, wherein the self-assemblable polymer has a glass transition temperature Tg and an order/disorder transition temperature To/d when in the second molecular configuration, and wherein the Flory Huggins parameter for the self-assemblable polymer in the first molecular configuration at the glass transition temperature Tg is at least 1.2 times the Flory Huggins parameter for self-assemblable polymer when in the second molecular configuration at its order/disorder transition temperature To/d.

11. A self-assemblable polymer which is a block copolymer comprising one or more first blocks of first monomers and one or more second blocks of second monomers, the block copolymer having first and second molecular configurations,
wherein the first molecular configuration has the first monomers in a first molecular arrangement and the second molecular configuration has the first monomers in a second molecular arrangement,
wherein the self-assemblable polymer is configurable from the first molecular configuration to the second molecular configuration, from the second molecular configuration to the first molecular configuration, or both, by the application of a stimulus, and
wherein the first monomers when in the first molecular arrangement have a lower chemical affinity for the second monomers than the first monomers when in the second molecular arrangement.

12. A method for providing an ordered layer of self-assemblable polymer on a substrate, the self-assemblable polymer having a first molecular configuration when assembled in the ordered layer, the method comprising:
providing a layer of a self-assemblable polymer on the substrate,
heating the self-assemblable polymer to a first temperature $T_1$ above its glass transition temperature Tg, with the self-assemblable polymer configured into a second molecular configuration, wherein the first temperature $T_1$ is below an order/disorder transition temperature To/d for the self-assemblable polymer in the second molecular configuration, and the self-assemblable polymer assembles to provide the ordered polymer layer,
returning the self-assemblable polymer to its first molecular configuration, and
cooling the self-assemblable polymer to a temperature below its glass transition temperature Tg,
wherein the first molecular configuration provides a higher Flory Huggins parameter for the self-assemblable polymer than the second molecular configuration.

13. A method for providing an ordered layer of self-assemblable polymer on a substrate,
wherein the self-assemblable polymer is a block copolymer comprising one or more first blocks of first monomers and one or more second blocks of second monomers, the block copolymer having first and second molecular configurations, wherein the first molecular configuration has the first monomers in a first molecular arrangement and the second molecular configuration has the first monomers in a second molecular arrangement, wherein the first monomers when in the first molecular arrangement have a lower chemical affinity for the second monomers than the first monomers when in the second molecular arrangement, and wherein the self-assemblable polymer has the first molecular configuration in the ordered layer, the method comprising:

heating a layer of the self-assemblable polymer on the substrate to a first temperature $T_1$ above its glass transition temperature Tg, with the self-assemblable polymer configured into the second molecular configuration, wherein the first temperature $T_1$ is below an order/disorder transition temperature To/d for the self-assemblable polymer in the second molecular configuration, and the self-assemblable polymer assembles to provide the ordered polymer layer, returning the self-assemblable polymer to its first molecular configuration, and cooling the self-assemblable polymer to a temperature below its glass transition temperature Tg.

14. The method according to claim 12, wherein the self-assemblable polymer is configurable from the first molecular configuration to the second molecular configuration, from the second molecular configuration to the first molecular configuration, or both, by the application of a stimulus.

15. The method according to claim 14, wherein the stimulus comprises actinic radiation.

16. The method according to claim 14, wherein the stimulus comprises temperature.

17. The method according to claim 12, further comprising heating the self-assemblable polymer layer to a second temperature $T_2$ while the self-assemblable polymer is in the second molecular configuration, wherein the second temperature $T_2$ is greater than the order/disorder transition temperature To/d for the polymer when in the second molecular configuration.

18. The method according to claim 17, wherein the self-assemblable polymer layer is annealed by varying its temperature in the range between the first temperature $T_1$ and the second temperature $T_2$ prior to returning the self-assemblable polymer to its first molecular configuration, and prior to cooling the self-assemblable polymer to a temperature below its glass transition temperature Tg.

19. The method according to claim 17, wherein the self-assemblable polymer layer is annealed by applying a stimulus to alternate the self-assemblable polymer from its second molecular configuration to its first molecular configuration at the second temperature $T_2$ prior to cooling the self-assemblable polymer in its first molecular configuration to a temperature below its glass transition temperature Tg, wherein $T_2$ is less than To/d for the self-assemblable polymer when in the first molecular configuration.

20. A lithography method for patterning a surface of a substrate by resist etching, wherein the method comprises providing an ordered layer of self-assemblable polymer at the surface by the method of claim 12, wherein the ordered polymer layer acts as a resist layer.

* * * * *